(12) United States Patent
Muronoi

(10) Patent No.: US 12,496,676 B2
(45) Date of Patent: Dec. 16, 2025

(54) METHODS OF PROCESSING SEMICONDUCTOR WAFERS USING DOUBLE SIDE GRINDING OPERATIONS

(71) Applicant: GlobalWafers Co., Ltd., Hsinchu (TW)

(72) Inventor: Tsunehiro Muronoi, Otawara (JP)

(73) Assignee: GlobalWafers Co., Ltd., Hsinchu (TW)

( * ) Notice: Subject to any disclaimer, the term of this patent is extended or adjusted under 35 U.S.C. 154(b) by 380 days.

(21) Appl. No.: 18/160,071

(22) Filed: Jan. 26, 2023

(65) Prior Publication Data

US 2024/0253173 A1    Aug. 1, 2024

(51) Int. Cl.
*B24B 7/22*    (2006.01)
*H01L 21/02*   (2006.01)
*H01L 21/304*  (2006.01)

(52) U.S. Cl.
CPC ........ *B24B 7/228* (2013.01); *H01L 21/02013* (2013.01); *H01L 21/304* (2013.01)

(58) Field of Classification Search
None
See application file for complete search history.

(56) References Cited

U.S. PATENT DOCUMENTS

| | | | |
|---|---|---|---|
| 6,114,245 A | 9/2000 | Vandamme et al. | |
| 7,278,903 B2 | 10/2007 | Masuda | |
| 7,601,049 B2 | 10/2009 | Bhagavat et al. | |
| 7,867,059 B2 | 1/2011 | Pietsch et al. | |
| 7,927,185 B2 | 4/2011 | Vandamme et al. | |
| 7,930,058 B2 | 4/2011 | Bhagavat et al. | |
| 8,145,342 B2 | 3/2012 | Bhagavat et al. | |
| 8,267,745 B2 | 9/2012 | Bhagavat et al. | |
| 8,712,575 B2 | 4/2014 | Bhagavat et al. | |
| 9,393,669 B2 | 7/2016 | Kalenian et al. | |
| 9,601,395 B2 | 3/2017 | Bhagavat et al. | |
| 10,522,373 B2 | 12/2019 | Kuwana et al. | |
| 2011/0101504 A1 | 5/2011 | Bhagavat et al. | |
| 2012/0028555 A1 | 2/2012 | Zhang et al. | |
| 2015/0147942 A1* | 5/2015 | Sato | H01L 21/02024 451/41 |
| 2020/0039021 A1* | 2/2020 | Kubota | B24B 37/28 |

FOREIGN PATENT DOCUMENTS

| | | |
|---|---|---|
| JP | 4490822 B2 | 6/2010 |
| JP | 220104211 A | 7/2020 |

OTHER PUBLICATIONS

PCT Invitation to Pay Additional Fees and Partial Search Report issued in PCT/US2024/012482 mailed on May 15, 2024, pp. 1-14.

* cited by examiner

*Primary Examiner* — Stephanie P Duclair
(74) *Attorney, Agent, or Firm* — Armstrong Teasdale LLP

(57) ABSTRACT

A method of processing a semiconductor wafer includes placing the wafer in a carrier such that a first grinding wheel engages the front surface of the wafer and a second grinding wheel engages the back surface of the wafer. The method also includes performing a first grinding operation in which the first and second grinding wheels rotate in counter-rotation manner and the wafer is rotated in a first direction that matches a rotational direction of the first grinding wheel, whereby a portion of the front and/or back surfaces of the wafer is removed. The method also includes performing a second grinding operation in which the first and second grinding wheels rotate in counter-rotation manner and the wafer is rotated in a second direction that matches a rotational direction of the second grinding wheel, whereby another portion of the front and/or back surfaces of the wafer is removed.

19 Claims, 11 Drawing Sheets

METHODS OF PROCESSING SEMICONDUCTOR WAFERS USING DOUBLE SIDE GRINDING OPERATIONS

FIELD

The field relates generally to simultaneous double side grinding of semiconductor wafers and, more particularly, to methods of processing semiconductor wafers using multiple double side grinding operations.

BACKGROUND

Semiconductor wafers (e.g., single crystal silicon wafers) are commonly used in the production of integrated circuit chips on which circuitry is printed. The precise circuitry requires that wafer surfaces be extremely flat and parallel to each other to ensure that the circuitry can be properly printed over the entire surface of the wafer. To accomplish this, a wafer treatment process may be used to improve certain features of the wafers (e.g., flatness and parallelism) after they are cut from an ingot (e.g., a single crystal silicon ingot grown using a Czochralski growth process or a float zone growth process).

Simultaneous double side grinding operates on both sides of the semiconductor wafer at the same time. Double side grinding apparatus typically include a pair of hydrostatic pads and a pair of grinding wheels to perform a grinding operation on the wafer surfaces. The pads and wheels are oriented in opposed, mirrored relation to one or more wafers supported therebetween in a vertical orientation. The hydrostatic pads may produce a fluid barrier by introducing a grinding fluid (e.g., water) between the respective pad and wafer surface which limits or prevents the rigid pads from physically contacting the wafer during grinding. This barrier reduces damage to the wafer that may be caused by physical clamping and allows the wafer to move (rotate) tangentially relative to the pad surfaces with less friction. The grinding wheels are rotated and engage a respective wafer surface to remove a portion of the respective wafer surface. The wafer is also rotated between the grinding wheels and the hydrostatic pads. Rotation of the wafer may be enabled by a drive ring that engages a notch formed in a circumferential edge of the wafer.

This background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

One aspect is a method of processing a semiconductor wafer using a double side grinding apparatus including a first grinding wheel, a second grinding wheel, and a carrier for supporting the wafer between the first and second grinding wheels. The wafer has a front surface and a back surface. The method includes placing the wafer in the carrier such that the first grinding wheel engages the front surface of the wafer and the second grinding wheel engages the back surface of the wafer. The method also includes performing a first grinding operation of the double side grinding apparatus in which the first and second grinding wheels rotate in counter-rotation manner relative to each other and the wafer is rotated in a first direction that matches a rotational direction of the first grinding wheel, whereby a first portion of at least one of the front and back surfaces of the wafer is removed. The method also includes performing a second grinding operation of the double side grinding apparatus in which the first and second grinding wheels rotate in counter-rotation manner relative to each other and the wafer is rotated in a second direction that matches a rotational direction of the second grinding wheel, whereby a second portion of at least one of the front and back surfaces of the wafer is removed.

Another aspect is a method of processing a semiconductor wafer using a double side grinding apparatus including a first grinding wheel, a second grinding wheel, and a carrier for supporting the wafer between the first and second grinding wheels. The wafer has a front surface and a back surface. The method includes placing the wafer in the carrier such that the first grinding wheel engages the front surface of the wafer and the second grinding wheel engages the back surface of the wafer. The method also includes performing a first grinding operation of the double side grinding apparatus in which the first and second grinding wheels rotate in counter-rotation manner relative to each other and the wafer is rotated in a wafer rotation direction that matches a rotational direction of one of the first grinding wheel and the second grinding wheel, whereby a first portion of at least one of the front and back surfaces of the wafer is removed. The method also includes performing a second grinding operation of the double side grinding apparatus in which at least one process parameter is adjusted relative to the first grinding operation, whereby a second portion of at least one of the front and back surfaces of the wafer is removed to enhance at least one of in plane displacement, warp, and nanotopology of the wafer.

Another aspect is a method of processing semiconductor wafers using a double side grinding apparatus including first grinding wheels, second grinding wheels each corresponding to one of the first grinding wheels, and carriers for respectively supporting each of the wafers between one of the first grinding wheels and the corresponding second grinding wheel during a grinding operation. Each wafer has a front surface and a back surface. The method includes, for each wafer, placing the wafer in the respective carrier such that the first grinding wheel engages the front surface of the respective wafer and the corresponding second grinding wheel engages the back surface of the respective wafer. The method also includes performing a first grinding operation of the double side grinding apparatus in which the first and corresponding second grinding wheels rotate in counter-rotation manner relative to each other and the respective wafer is rotated in a first direction that matches a rotational direction of the first grinding wheel, whereby a first portion of at least one of the front and back surfaces of the respective wafer is removed. The method also includes performing a second grinding operation of the double side grinding apparatus in which the first and corresponding second grinding wheels rotate in counter-rotation manner relative to each other and the respective wafer is rotated in a second direction that matches a rotational direction of the second grinding wheel, whereby a second portion of at least one of the front and back surfaces of the respective wafer is removed.

Various refinements exist of the features noted above in relation to the various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. Again, the brief summary presented above is intended only to familiarize the reader with certain aspects and contexts of the present disclosure without limitation to the claimed subject matter.

BRIEF DESCRIPTION OF THE DRAWINGS

Like reference characters indicate like components throughout the several views of the drawings.

DETAILED DESCRIPTION

Suitable "semiconductor wafers" (which may also be referred to as "silicon wafers" or "wafers") include single-crystal silicon wafers, such as, for example, silicon wafers obtained by slicing the wafers from single crystal silicon ingots formed by the Czochralski method or the float zone method. Each semiconductor wafer includes a central axis, a front surface, and a back surface generally parallel to the front surface. The front and back surfaces are generally perpendicular to the central axis. A circumferential edge extends between the front and back surfaces. The wafers may be any suitable diameter including, for example, 200 millimeter (mm), 300 mm, 450 mm diameter or greater.

Figure 1:
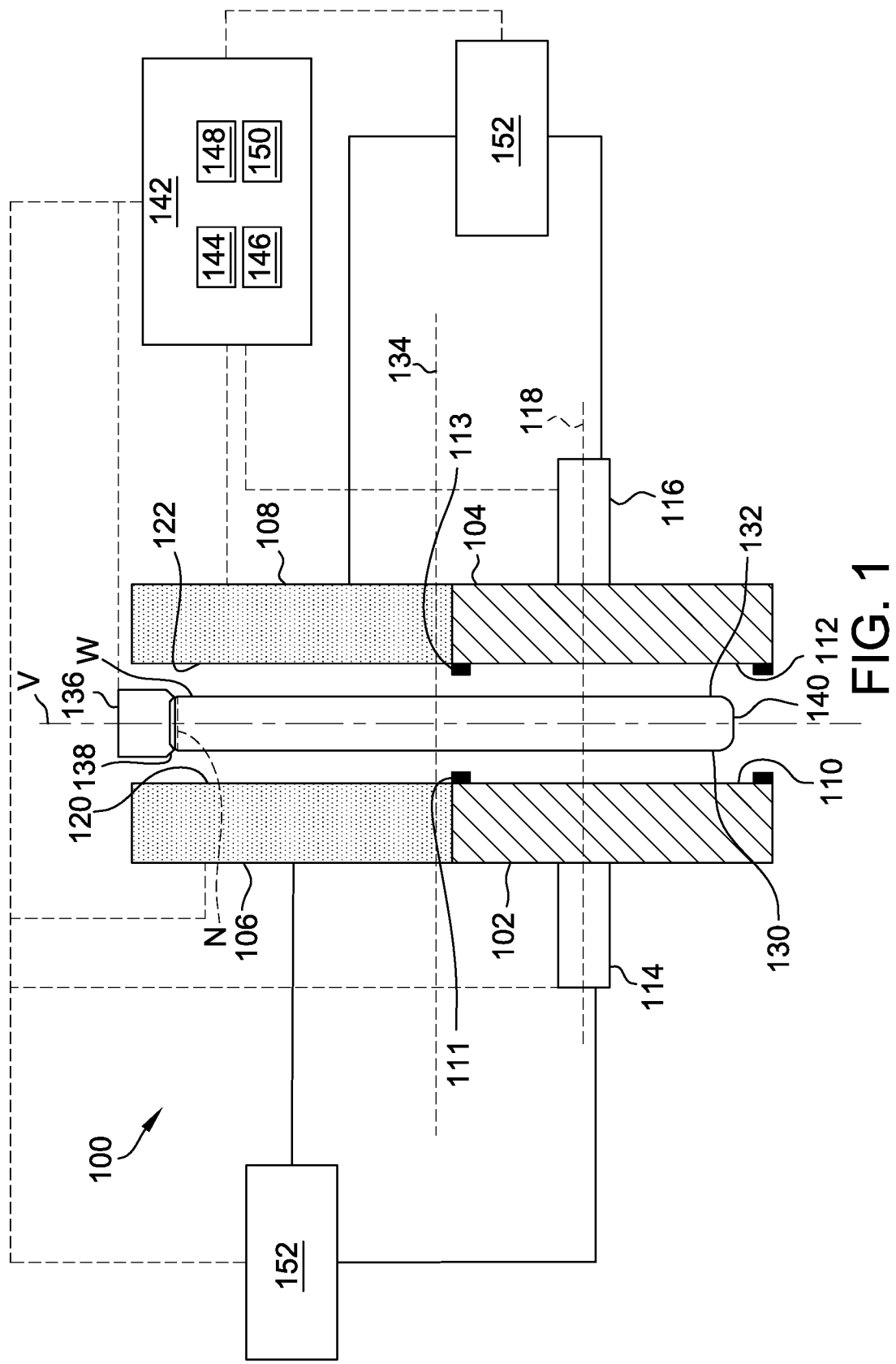
FIG. 1 is a schematic cross-section of a pair of grinding wheels and a corresponding pair of hydrostatic pads of a double side grinding apparatus.
Figure 3:
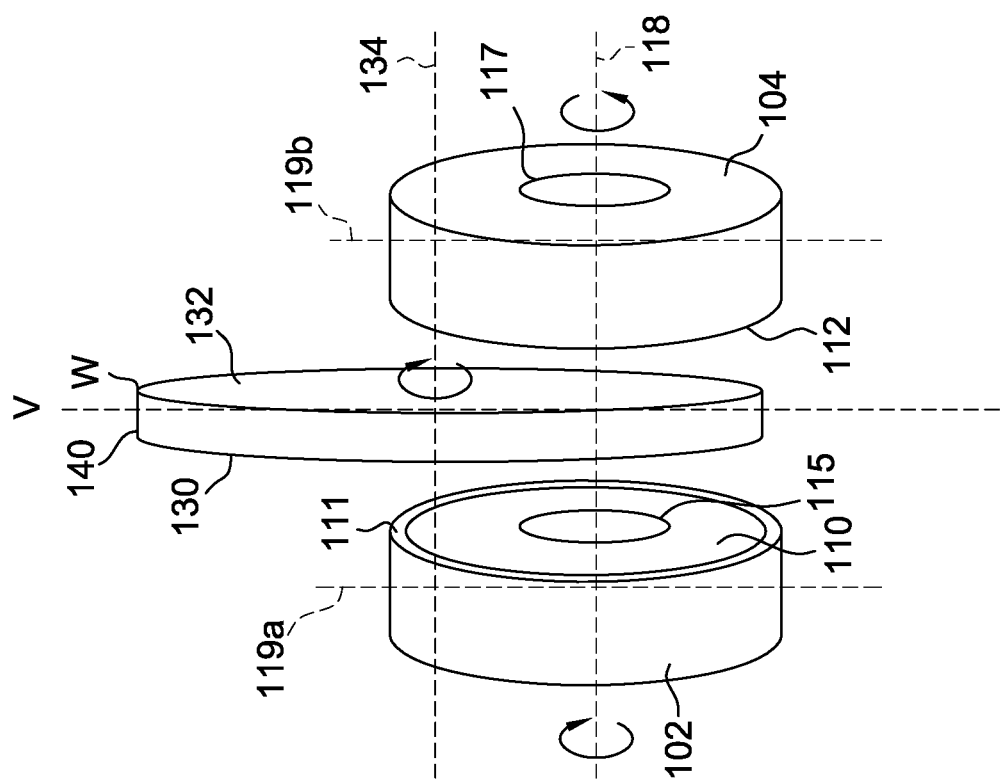
FIG. 3 is a schematic perspective of a semiconductor wafer positioned between the grinding wheels shown in FIG. 1, the hydrostatic pads being omitted.
Figure 2:
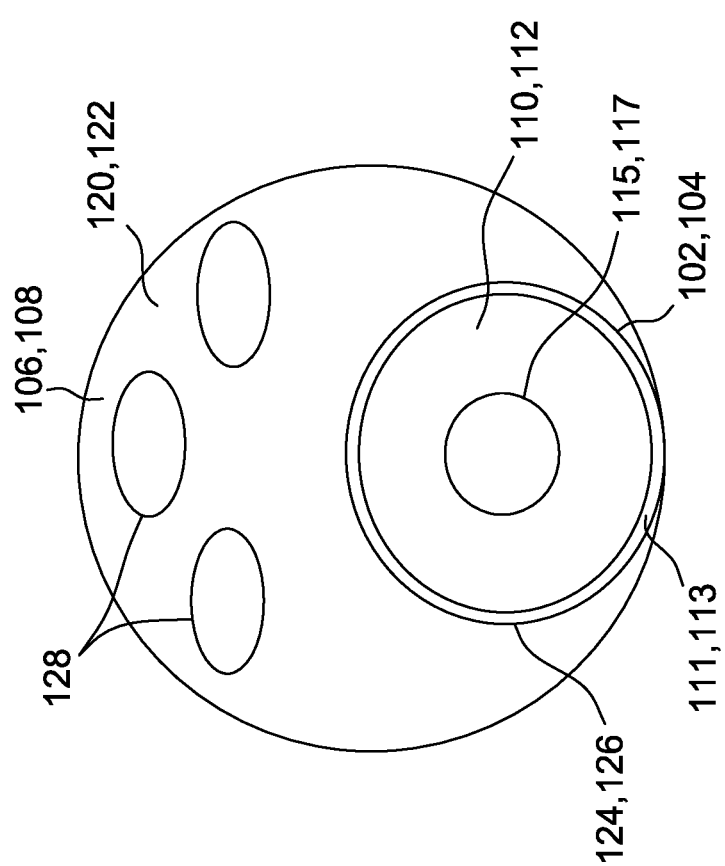
FIG. 2 is a schematic front view of one of the grinding wheels and the corresponding hydrostatic pad of the double side grinding apparatus of FIG. 1.

Referring to FIGS. 1-3, a portion of a double side grinding apparatus is shown schematically and indicated generally at 100. Non-limiting examples of double side grinders suitable for use as the double side grinding apparatus 100 include model DXSG320 and model DXSG300A manufactured by Koyo Machine Industries Co., Ltd. The grinding apparatus 100 includes a pair of grinding wheels 102 and 104 and a pair of hydrostatic pads 106 and 108. A semiconductor wafer W is placed between the grinding wheels 102 and 104 and between the hydrostatic pads 106 and 108 during a grinding operation. The grinding wheel 102 and the hydrostatic pad 106 are located on one side of the wafer W and the grinding wheel 104 and the hydrostatic pad are located on an opposite side of the wafer W. The semiconductor wafer W has two opposing, generally parallel surfaces 130 and 132, one of the surfaces may be referred to as a front surface 130 of the wafer W and the other surface may be referred to as a back surface 132 of the wafer W. The front surface 130 faces the grinding wheel 102 and the hydrostatic pad 106 and the back surface 132 faces the grinding wheel 104 and the hydrostatic pad 108 when the wafer W is placed therebetween. As such, both surfaces 130 and 132 of the wafer W are simultaneously ground at the same time during a grinding operation. This improves flatness and parallelism of the surfaces 130 and 132 of the wafer W prior to subsequent wafer processing steps (e.g., polishing and circuitry printing).

As shown in FIG. 1, the wafer W is suitably supported in a substantially vertical position within the grinding apparatus 100, such that a central axis 134 of the wafer W is substantially perpendicular to a vertical axis V. Alternatively, the wafer W may be supported in another orientation in the grinding apparatus 100, such as a substantially horizontal position. In the example grinding apparatus 100, a single wafer W is placed between the grinding wheels 102 and 104 and the hydrostatic pads 106 and 108 for a grinding operations. A single wafer W or multiple wafers W (i.e., two or more wafers W) may be placed in the grinding apparatus 100 for a grinding operation performed on each of the wafers. The grinding apparatus 100 may include multiple pairs of the grinding wheels 102 and 104 and multiple pairs of the hydrostatic pads 106 and 108, with each pair of the grinding wheels 102 and 104 and each pair of the hydrostatic pads 106 and 108 operating on one of multiple wafers W for the grinding operation.

The grinding wheels 102 and 104 each include a grinding surface 110 and 112, respectively. The grinding wheels 102 and 104 are each mounted onto the grinding apparatus 100 via shafts 114 and 116, respectively. The grinding wheels; and 104 are substantially identical to one another. The grinding wheels 102 and 104 are oriented on the shafts 114 and 116 such that the grinding surfaces 110 and 112 face one another. Additionally, the grinding surface 110 faces the front surface 130 of the wafer W and the grinding surface 112 faces the back surface 132 of the wafer W when the wafer is placed between the grinding wheels 102 and 104.

The grinding surface 110 and 112 of the respective grinding wheel 102 and 104 may include an outwardly-extending annular grinding ring 111 and 113. Each grinding ring 111 and 113 may be defined by an annular array of grinding teeth. As shown in FIGS. 1 and 2, the annular grinding rings 111 and 113 extend circumferentially at or near the periphery of the respective grinding surface 110 and 112. The grinding wheels 102 and 104 may be cup-shaped such that the annular grinding rings 111 and 113 define a peripheral edge of the grinding surface 110 and 112 and the remaining portion of the respective grinding surface 110 and 112 depends inwardly from the grinding ring 111 and 113. The grinding rings 111 and 113 may define a portion of the respective grinding surface 110 and 112 that engages the respective front and back surface 130 and 132 of the wafer W to facilitate a grinding operation, and a remaining portion of the grinding surface 110 and 112 may not engage the wafer W during a grinding operation. Alternatively, the grinding wheels 102 and 104 may have any configuration that enables the grinding surfaces 110 and 112, or a portion thereof, to suitably engage the wafer W and facilitate a grinding operation. Description of the grinding surfaces 110 and 112 engaging the wafer W includes examples where at least a portion of the grinding surfaces 110 and 112 (e.g., the grinding rings 111 and 113) engages the wafer W.

The grinding wheels 102 and 104 may be attached or connected to a motor or actuator (not shown) via shafts 114 and 116. The motor or actuator enables rotational and translational movement of the grinding wheels 102 and 104 relative to a rotational axis 118. Translational movement of the grinding wheels 102 and 104 enables the grinding surfaces 110 and 112 to respectively engage the front surface 130 and back surface 132 of the wafer W for a grinding operation. Rotational movement of the grinding wheels 102 and 104 is performed during the grinding operation to remove a portion of the front surface 130 and back surface 132 of the wafer W, thereby improving flatness and parallelism of the surfaces 130 and 132 of the wafer W.

As shown in FIGS. 2 and 3, the grinding wheels 102 and 104 respectively include an opening 115 and 117 extending therethrough. The openings 115 and 117 enable a grinding fluid (e.g., water) to be supplied between the grinding surfaces 110 and 112 and the wafer W during a grinding operation. The grinding fluid (e.g., water) is supplied to the openings 115 and 117 via a grinding fluid source 152 (shown in FIG. 1) that is in fluid connection with the grinding wheels 102 and 104. The grinding fluid flows through the openings 115 and 117 and is injected onto the front surface 130 and the back surface 132 of the wafer W. The grinding surfaces 110 and 112 work the grinding fluid against the front and back surfaces 130 and 132 of the wafer W to remove material from the surfaces of the wafers W, resulting in flatter surfaces 130 and 132. A flow rate of the grinding fluid supplied to the openings 115 and 117 via the source 152 may be adjusted during a grinding operation to adjust the removal profile on the front and back surfaces 130 and 132 of the wafer W. For example, the source 152 may include a pump that is selectively controlled to adjust a flow rate of the grinding fluid supplied to the grinding wheels 102 and 104. The grinding fluid may be independently supplied to each of the openings 115 and 117, and the flow rate of the grinding fluid supplied to each of the openings 115 and 117 may be independently controlled. More than one grinding fluid source 152 may be included in the apparatus 100 to independently supply grinding fluid to the grinding wheels 102 and 104. Alternatively, grinding fluid may be supplied to the grinding wheels 102 and 104 via the same source 152 and the same flow rate may be supplied to each grinding wheel 102 and 104.

The hydrostatic pads 106 and 108 are mounted to a hydrostatic support base (not shown) of the grinding apparatus 100. One or both of the hydrostatic pads 106 and 108 may be attached or connected to the respective hydrostatic support base and a motor or actuator (not shown) that enables translational movement of the one or both of the hydrostatic pads 106 relative to the rotational axis 118. The hydrostatic pads 106 and 108 are not configured to rotate as the pads remain substantially stationary during a grinding operation. The hydrostatic pads 106 and 108 each have a pad surface 120 and 122, respectively. The hydrostatic pads 106 and 108 are substantially identical to one another, and the pad surfaces 120 and 122 are substantially flat. The hydrostatic pads 106 and 108 are oriented such that the pad surfaces 120 and 122 face each other. Additionally, the pad surface 120 faces the front surface 130 of the wafer W and the pad surface 122 faces the back surface 132 of the wafer W when the wafer is placed between the hydrostatic pads 106 and 108.

As shown in FIG. 2, each hydrostatic pad 106 and 108 is generally disk-shaped. Suitably, each hydrostatic pad has a diameter that is greater than a diameter of a semiconductor wafer W to be ground. A round, open portion 124 and 126 is formed in the hydrostatic pads 106 and 108, respectively. The open portions 124 and 126 are formed near an outer peripheral side of the respectively hydrostatic pad 106 and 108, such that the hydrostatic pads 106 and 108 have a crescent shape as shown in FIG. 2. The open portions 124 and 126 are sized and shaped to receive one of the grinding wheels 102 and 104 therein. The grinding wheels 102 and 104 are positioned within the respective open portion 124 and 126 and suitably extend beyond a circumferential edge 140 of the wafer W. The grinding wheels 102 and 104 are also rotatable relative to the hydrostatic pads 106 and 108 during the grinding operation.

Still referring to FIG. 2, each hydrostatic pad 106 and 108 includes pockets 128 formed in the respective pad surface 120 and 122. A grinding fluid (e.g., water) is supplied to the pockets 128 from the grinding fluid source 152 that is in fluid connection with the pockets 128. The grinding fluid source 152 may be the same source 152 that is in fluid connection with the grinding wheels 102 and 104, or a different grinding fluid source 152 may be included in the apparatus 100 for supplying grinding fluid to the hydrostatic pads 106 and 108. The apparatus 100 may include a separate grinding fluid sources 152 to respectively supply grinding fluid to the grinding wheels 102 and 104 independently and the hydrostatic pads 106 and 108 independently. The grinding fluid supplied to the pockets 128 may the same grinding fluid or a different grinding fluid as is supplied to the grinding wheels 102 and 104. The grinding fluid supplied to the hydrostatic pads 106 and 108 is injected through the pockets 128 onto the front surface 130 and the back surface 132 of the wafer W. The grinding fluid supplied through the pockets 128 forms a fluid layer between the hydrostatic pads 106 and 108 and the wafer W, and the wafer W is hydrostatically supported therebetween during a grinding operation as the grinding surfaces 110 and 112 operate on the surfaces 130 and 132 of the wafer W. The supported state of the wafer W between the hydrostatic pads 106 and 108 may be adjusted by controlling the flow rate of the grinding fluid supplied to the pockets 128.

Referring back to FIG. 1, the wafer W is placed into the grinding apparatus 100 and supported by a wafer carrier (not shown) located between the grinding wheels 102 and 104 and between the hydrostatic pads 106 and 108. The wafer W is rotated by an appropriate mechanism during a grinding operation. For example, the wafer W is rotated by a drive ring 136. The drive ring 136 moves the wafer W in rotation relative to the grinding wheels 102 and 104 and the hydrostatic pads 106 and 108. A detent, or coupon 138, of the drive ring 136 engages the wafer W generally at a notch N formed in the circumferential edge 140 of the wafer W to move the wafer in rotation about its central axis 134. At the same time, the grinding wheels 102 and 104 engage the respective front and back surfaces 130 and 132 of the wafer W and rotate in counter-rotation manner (i.e., in opposite directions to one another). One of the wheels 102 or 104 rotates in the same direction as the wafer W and the other wheel 102 or 104 rotates in an opposite direction to the wafer W.

The grinding wheels 102 and 104 are oriented such that a diametrical axis 119a and 119b (shown in FIG. 3) of the grinding wheels 102 and 104, respectively, extends substantially parallel to the respective front and back surfaces 130 and 132 of the wafer W and, as such, substantially parallel to the vertical axis V. In some grinding operations, one or both of the grinding wheels 102 and 104 may be oriented or tilted at an oblique angle relative to the front and back surfaces 130 and 132 of the wafer W such that the diametrical axis 119*a* and/or 119*b* extends at an oblique angle relative to the vertical axis V, described below with reference to FIG. 8A. The orientation or "tilt" of the grinding wheels 102 and 104 may be selected to control the removal profile of the respective surface 130 and 132 of the wafer W during a grinding operation.

Still referring to FIG. 1, the grinding apparatus 100 also includes a controller 142 that allows an operator to select and control process parameters of the grinding apparatus 100 during a grinding operation. For example, the operator may select a rotational direction of the wafer W, a rotational speed of the wafer W, rotational speeds of one or both of the grinding wheels 102 and 104, an orientation or "tilt" of one or both of the grinding wheels 102 and 104, and/or a flow rate of the grinding fluid supplied to the grinding wheels 102 and 104. The controller 142 is connected to and in communication with the grinding wheels 102 and 104 (e.g., via the motor or actuator operatively connected thereto), the hydrostatic pads 106 and 108 (e.g., via the motor or actuator operatively connected thereto), the grinding fluid source (s) 152 (e.g., with the grinding fluid pump of the grinding fluid source (s) 152), and the drive ring 136.

The controller 142 may be any known computing device or computer system and includes one or more processors 144 and a memory area 146. The processor 144 executes instructions stored in the memory area 146. The term "processor", as used herein, refers to central processing units, microprocessors, microcontrollers, reduced instruction set circuits (RISC), application specific integrated circuits (ASIC), logic circuits, and any other circuit or processor capable of executing the functions described herein. The above are examples, and are not intended to limit in any way the definition and/or meaning of the term "processor." In addition, one or more processors 144 may be in one computing device or a plurality of computing devices acting in parallel.

Stored in the memory area 146 are, for example, processor-executable instructions for receiving and processing input received from an operator (e.g., via a user interface 148) and controlling process parameters of the grinding apparatus 100 based on the processed input received from the operator. The memory area 146 may include, but is not limited to, any computer-operated hardware suitable for storing and/or retrieving processor-executable instructions and/or data. The memory area 146 may include random access memory (RAM) such as dynamic RAM (DRAM) or static RAM (SRAM), read-only memory (ROM), erasable programmable read-only memory (EPROM), electrically erasable programmable read-only memory (EEPROM), and nonvolatile RAM (NVRAM). Further, the memory area 146 may include multiple storage units such as hard disks or solid state disks in a redundant array of inexpensive disks (RAID) configuration. The memory area 146 may include a storage area network (SAN) and/or a network attached storage (NAS) system. In some embodiments, the memory area 146 includes memory that is integrated in controller 142. For example, the controller 142 may include one or more hard disk drives as the memory area 146. The memory area 146 may also include memory that is external to the controller 142 and may be accessed by a plurality of computing devices. The above memory types are for example only, and are thus not limiting as to the types of memory usable for storage of processor-executable instructions and/or data.

The controller 142 also includes a user input device 148 or user interface 148 for receiving input from an operator. The information may be one or more selected process parameters for a grinding operation. The input device 148 may include, for example, a keyboard, a pointing device, a mouse, a stylus, a touch sensitive panel (e.g., a touch pad or a touch screen), a gyroscope, an accelerometer, a position detector, or an audio input device. A single component such as a touch screen may function as both an output device of the controller 142 (e.g., a media output component) and the input device 148.

The controller 142 may also include a communication interface 150, which may be communicatively connected to one or more remote devices. The communication interface 150 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

Referring to FIGS. 1-3, during operation, the wafer W is placed in the wafer carrier between the grinding wheels 102 and 104 and the hydrostatic pads 106 and 108. The grinding apparatus 100 may be equipped for grinding multiple wafers W simultaneously, and may include multiple (e.g., two or more) pairs of the grinding wheels 102 and the grinding wheels 104, and multiple (e.g., two or more) pairs of the hydrostatic pads 106 and the hydrostatic pads 108 corresponding to the pairs of the grinding wheels 102 and 104. Multiple wafers W may be placed in the grinding apparatus 100 for a grinding operation. Each of the wafers W is placed between a respective pair of the grinding wheels 102 and 104 and a corresponding pair of the hydrostatic pads 106 and 108.

The grinding wheels 102 and 104 and/or the hydrostatic pads 106 and 108 may be at an initial or "idle" position when the wafer W is placed therebetween. In the idle position, the grinding wheels 102 and 104 and/or the hydrostatic pads 106 and 108 may be positioned a distance from the wafer W. The grinding wheels 102 and 104 and/or the hydrostatic pads 106 and 108 are then brought into grinding engagement with the wafer W by translational movement of the grinding wheels 102 and 104 and/or the hydrostatic pads 106 and 108 towards the respective surface 130 and 132 of the wafer W.

When the grinding wheels 102 and 104 and the hydrostatic pads 106 and 108 engage the respective surface 130 and 132 of the wafer W, the grinding wheels 102 and 104 and the hydrostatic pads 106 and 108 suitably apply a clamping force onto the wafer W. The clamping force applied by the grinding wheels 102 and 104 may be independent of the clamping force applied by the hydrostatic pads 106 and 108. As such, the grinding wheels 102 and 104 and the hydrostatic pads 106 and 108 may support the wafer W independently of one another. A clamping pressure of the grinding wheels 102 and 104 on the wafer W is centered at the rotational axis 118 of the wheels, and a clamping pressure of the hydrostatic pads 106 and 108 on the wafer W is centered near the central axis 134 of the wafer W. Suitably, the clamping pressure applied by the grinding wheels 102 and 104 is held coincident with the clamping pressure applied by the hydrostatic pads 106 and 108 during grinding, such that the wafer W remains in plane (i.e., does not bend) and is uniformly ground by the grinding wheels 102 and 104.

To perform a grinding operation, the grinding wheels 102 and 104 that engage the front and back surfaces 130 and 132 of the wafer W are rotated at a suitable rotational speed. The grinding wheels 102 and 104 rotate in counter-rotation manner (i.e., in opposite directions to one another). Suitable rotational speeds of the grinding wheels 102 and 104 include, for example, speeds between 3000 and 5400 rpm. The wafer W is also rotated during grinding at a suitable wafer rotational speed. The wafer W is rotated in the same direction as one of the grinding wheels 102 or 104 and, thus, in the opposite direction of the other one of the grinding wheels 102 or 104. Suitable wafer rotational speeds include, for example, speeds between 12 and 48 rpm. The front and back surfaces 130 and 132 of the wafer W are covered by the grinding surfaces 110 and 112 and the pad surfaces 120 and 122 to ensure that the grinding operation is performed completely across the surfaces 130 and 132. Grinding fluid (e.g., water) is injected onto the front surface 130 and the back surface 132 of the wafer W during the grinding via the openings 115 and 117 of the grinding wheels 102 and 104. The grinding surfaces 110 and 112 work the grinding fluid against the front and back surfaces 130 and 132 of the wafer W to remove material from the surfaces of the wafers W, resulting in flatter surfaces 130 and 132. Grinding fluid (e.g., water) is also supplied via the pockets 128 of the hydrostatic pads 106 and 108. The grinding fluid supplied via the pockets 128 forms a fluid layer between the hydrostatic pads 106 and 108 and the wafer W, and the wafer W is hydrostatically supported therebetween during a grinding operation as the grinding surfaces 110 and 112 operate on the surfaces 130 and 132 of the wafer W.

A grinding "recipe" design is set in an effort to produce targeted removal profiles of the surfaces 130 and 132 of the wafer W and achieve desired wafer flatness characteristics (e.g., shape, warp, and/or nanotopology of the wafer) via the grinding operation. The grinding recipe determines various process parameters that are controlled during the double side grinding operation. The operator may select the process parameters via controller 142. For example, the operator may select, via the controller 142, grinding process parameters such as, for example, a rotational direction of the wafer W, a rotational speed of the wafer W, rotational speeds of one or both of the grinding wheels 102 and 104, an orientation or "tilt" of one or both of the grinding wheels 102 and 104, and/or a flow rate of the grinding fluid supplied to the grinding wheels 102 and/or 104.

Recently, flatness specifications of semiconductor wafers used in the production of integrated circuit chips have increasingly tightened as integrated circuit chips are rapidly becoming more miniaturized. This trend continues to impose strict requirements related to acceptable wafer flatness parameters such as, for example, site backside ideal plane/range (SBIR), global backside ideal plane/range (GBIR), site frontside least squares focal plane range (SFQR), and edge site frontside least squares focal plane range (ESFQR). In general, these wafer flatness parameters are determined after additional processing (e.g., polishing) has been performed on the wafer surfaces. Meeting these wafer flatness parameters, however, requires that certain flatness characteristics (e.g., shape, warp, and/or nanotopology) of the double side ground wafer are met.

It has been discovered that requisite wafer characteristics are not consistently achieved via conventional double side grinding operations that include only one grinding operation. Significant yield loss may result because large quantities of double side ground wafers may not have the requisite wafer flatness characteristics to meet current demand. Yield loss may be compounded by the delay between the time that a double side ground wafer having undesirable flatness characteristics (e.g., nanotopology features) is produced and the time that the unsuitability of the wafer for further processing is discovered. This is because wafer flatness metrics (e.g., nanotopology, warp, and/or shape) may not be measured until after the double side ground wafer has been polished. At this stage, considerable time may have passed from when the wafer was double side processed, which may further increase the yield loss because a number of additional wafers may have been double side ground in the interim, each having undesirable flatness characteristics, before the problem is recognized and corrected. Moreover, an out-of-specification wafer may not be salvageable after the wafer has been polished. As a result, double side ground wafers that are not suitable for further processing to produce wafer substrates for device fabrication (e.g., in the production of integrated circuit chips) may need to be scrapped once the defects are discovered during subsequent processing (e.g., after a polishing process).

In the example methods, multiple (i.e., two or more) grinding operations are performed on a single wafer W (or multiple wafers W simultaneously) to achieve desired wafer flatness characteristics (e.g., shape, warp, and/or nanotopology of the wafer). In a first grinding operation, the first and second grinding wheels 102 and 104 rotate in counter-rotation manner relative to each other and the wafer W (or wafers W) is rotated in a wafer rotation direction that matches a rotational direction of one of the grinding wheels 102 and 104, and a first portion of at least one of the front and back surfaces 130 and 132 of the wafer is removed. In a second grinding operation, at least one process parameter is adjusted relative to the first grinding operation, and a second portion of at least one of the front and back surfaces 130 and 132 of the wafer W (or wafers W) is removed to enhance a wafer flatness characteristic of the wafer W (or wafers W), such as in plane displacement, warp, and/or nanotopology of the wafer W. For example, a rotational direction of the wafer W, a rotational speed of the wafer W, rotational speeds of one or both of the grinding wheels 102 and 104, an orientation or "tilt" of one or both of the grinding wheels 102 and 104, and/or a flow rate of the grinding fluid supplied to the grinding wheels 102 and/or 104 may be adjusted for the second grinding operation. Further grinding operations (e.g., a third grinding operation, a fourth grinding operation, a fifth grinding operation, a sixth grinding operations) may be performed, and a process parameter may be adjusted for each grinding operation. Any number of grinding operations may be performed, such as between two and ten grinding operations, and at least one process parameter may be adjusted for each grinding operation.

Figure 4A:
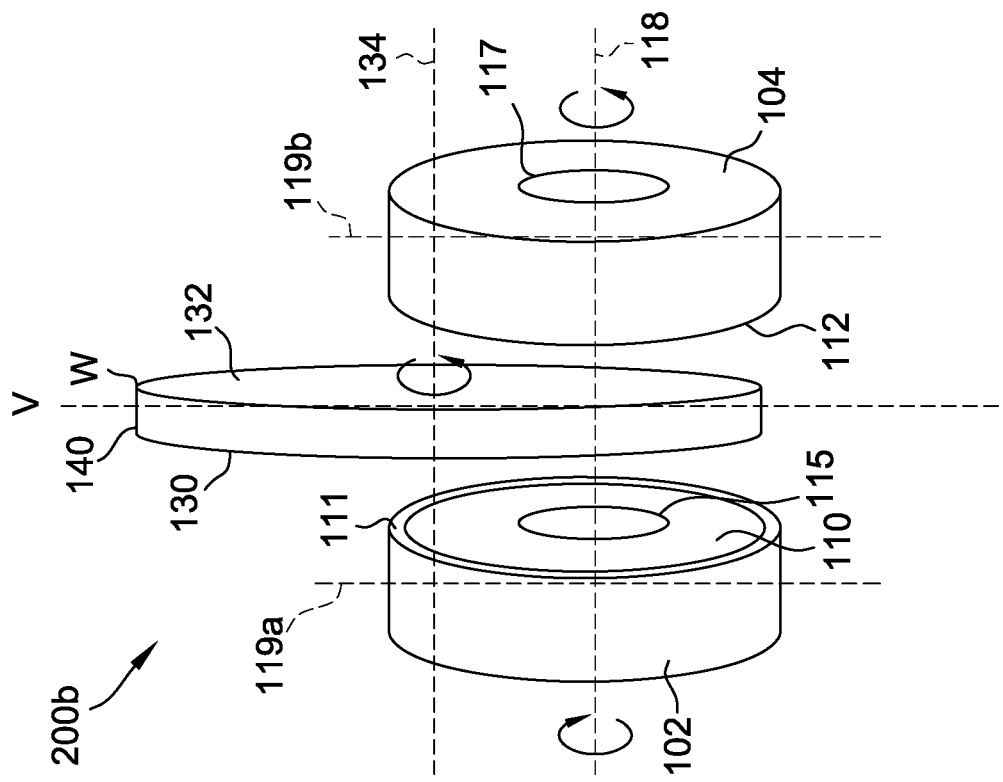
FIGS. 4A and 4B are schematics of an example process flow of multiple double side grinding operations performed on a semiconductor wafer.
Figure 4B:
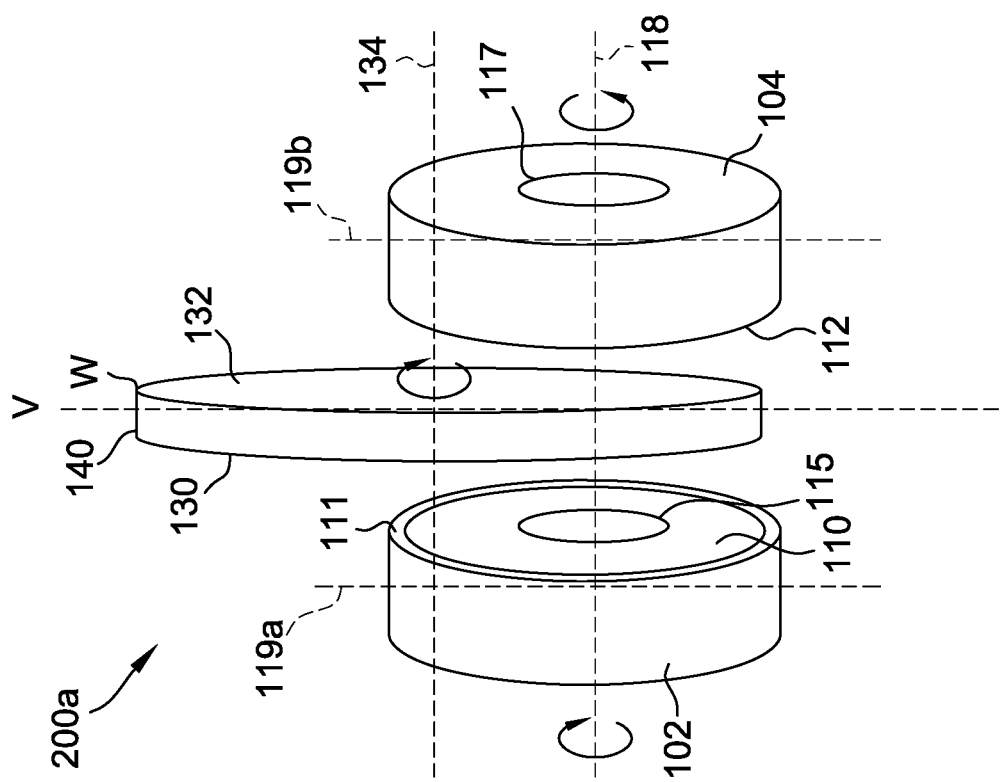

Referring to FIGS. 4A and 4B, an example process flow includes a first grinding operation, indicated generally at 200a in FIG. 4A, and a second grinding operation, indicated generally at 200b in FIG. 4B, performed on the wafer W using the grinding apparatus 100. The process flow shown in FIGS. 4A and 4B may be performed on multiple wafers W simultaneously or a single wafer W.

As shown in FIG. 4A, in the first grinding operation 200a, the wafer W is rotated in a first direction that matches a rotational direction of the grinding wheel 104. In the second grinding operation 200b, shown in FIG. 4B, the wafer W is rotated in a second direction that matches a rotational direction of the second grinding wheel 102. Although the wafer W is rotated in a direction that matches one of the grinding wheels 102 and 104 in each operation 200a and 200*b*, the rotational speed of the wafer W and each of the grinding wheels 102 and 104 may be different. For example, the wafer W may suitably be rotated, in both the first and second wafer directions, at a rotational speed between 12 and 48 rpm. The grinding wheels 102 and 104 may suitably be rotated at a rotational speed between 3000 and 5400 rpm, in each of the first and second grinding operations 200*a* and 200*b*. The process flow shown in FIGS. 4A and 4B is not limited to the specific sequence shown. For example, the second grinding operation 200*b* may be performed prior to the first grinding operation 200*a*. Additional grinding operations may be performed before, after, or as an intermediate grinding operation to the first grinding operation 200*a* and the second grinding operation 200*b*.

In addition to changing the rotational direction of the wafer W, one or other process parameters may be adjusted between the first grinding operation 200*a* and the second grinding operation 200*b*. For example, a rotational speed of the wafer W, rotational speeds of one or both of the grinding wheels 102 and 104, an orientation or "tilt" of one or both of the grinding wheels 102 and 104, and/or a flow rate of the grinding fluid supplied to the grinding wheels 102 and/or 104 may be adjusted between the first grinding operation 200*a* and the second grinding operation 200*b*. In one example, the wafer W is rotated at different speeds between the first grinding operation 200*a* and the second grinding operation 200*b*. For example, in the first grinding operation 200*a*, the wafer W is rotated in the first direction at a first rotational speed between 12 and 24 rpm and, in the second grinding operation 200*b*, the wafer W is rotated in the second direction at a second rotational speed between 24 and 36 rpm. In another example, at least one of the grinding wheels 102 and 104 has a different orientation or "tilt" relative to the wafer W between the first and second grinding operations 200*a* and 200*b*. For example, in the first grinding operation 200*a*, at least one of the grinding wheels 102 and 104 may be positioned at a first orientation in which the diametrical axis 119*a* and/or 119*b* is substantially parallel to the front and back surfaces 130 and 132 of the wafer W and the vertical axis V, and in the second grinding operation 200*b*, the at least one of the grinding wheels 102 and 104 may be positioned at a second orientation in which the diametrical axis 119*a* and/or 119*b* is at an oblique angle to the front and back surfaces 130 and 132 of the wafer W and the vertical axis V. In another example, grinding fluid may be supplied to the grinding wheels 102 and/or 104 at a different flow rate between the first and second grinding operations 200*a* and 200*b*. Any combination of the adjusted process parameters described above may be applied between the first and second grinding operations 200*a* and 200*b*.

Figure 5:
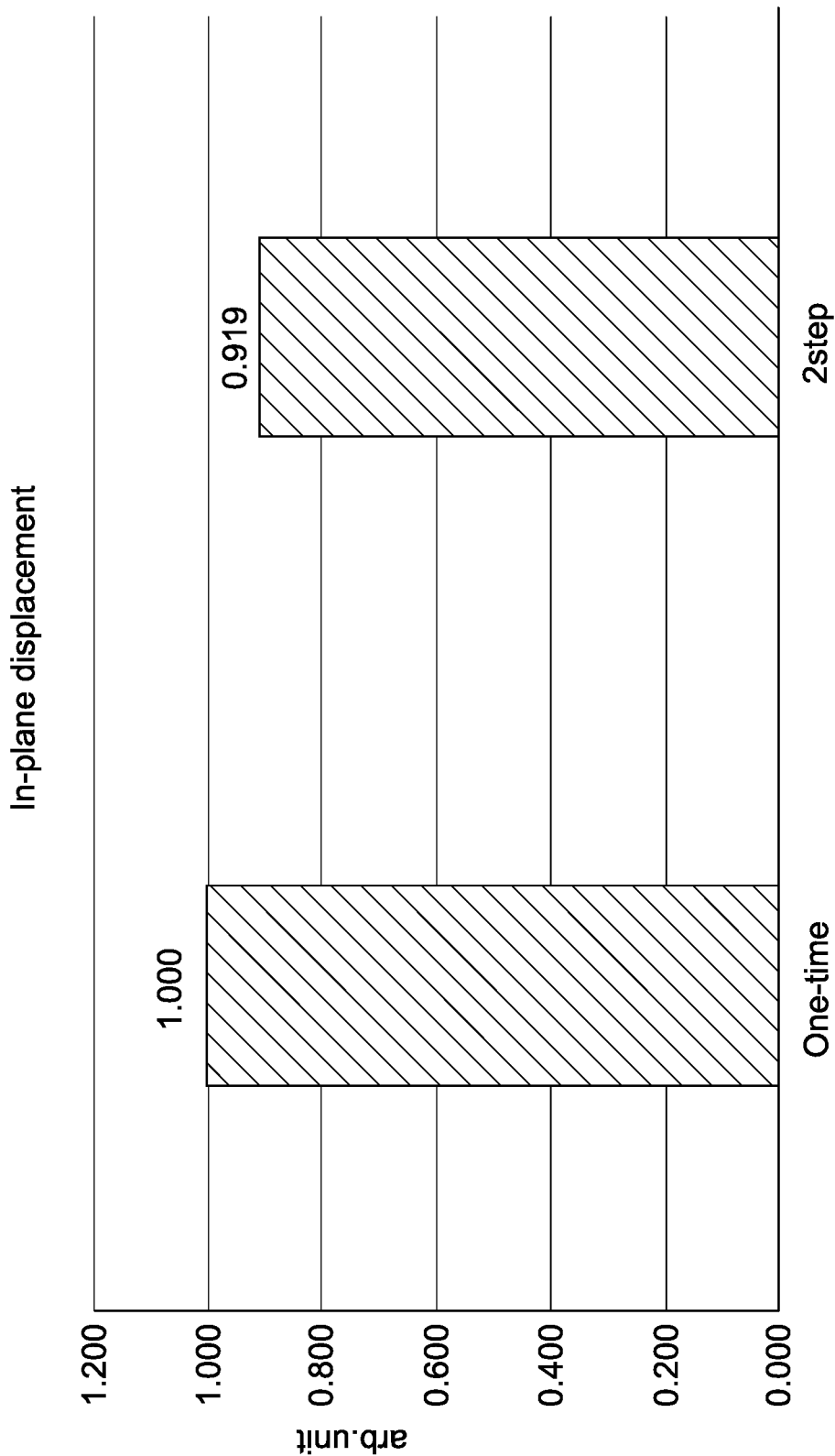
FIG. 5 is a plot comparing wafer in-plane displacement resulting from a conventional double side grinding operation and from the example process shown in FIGS. 4A and 4B.
Figure 6:
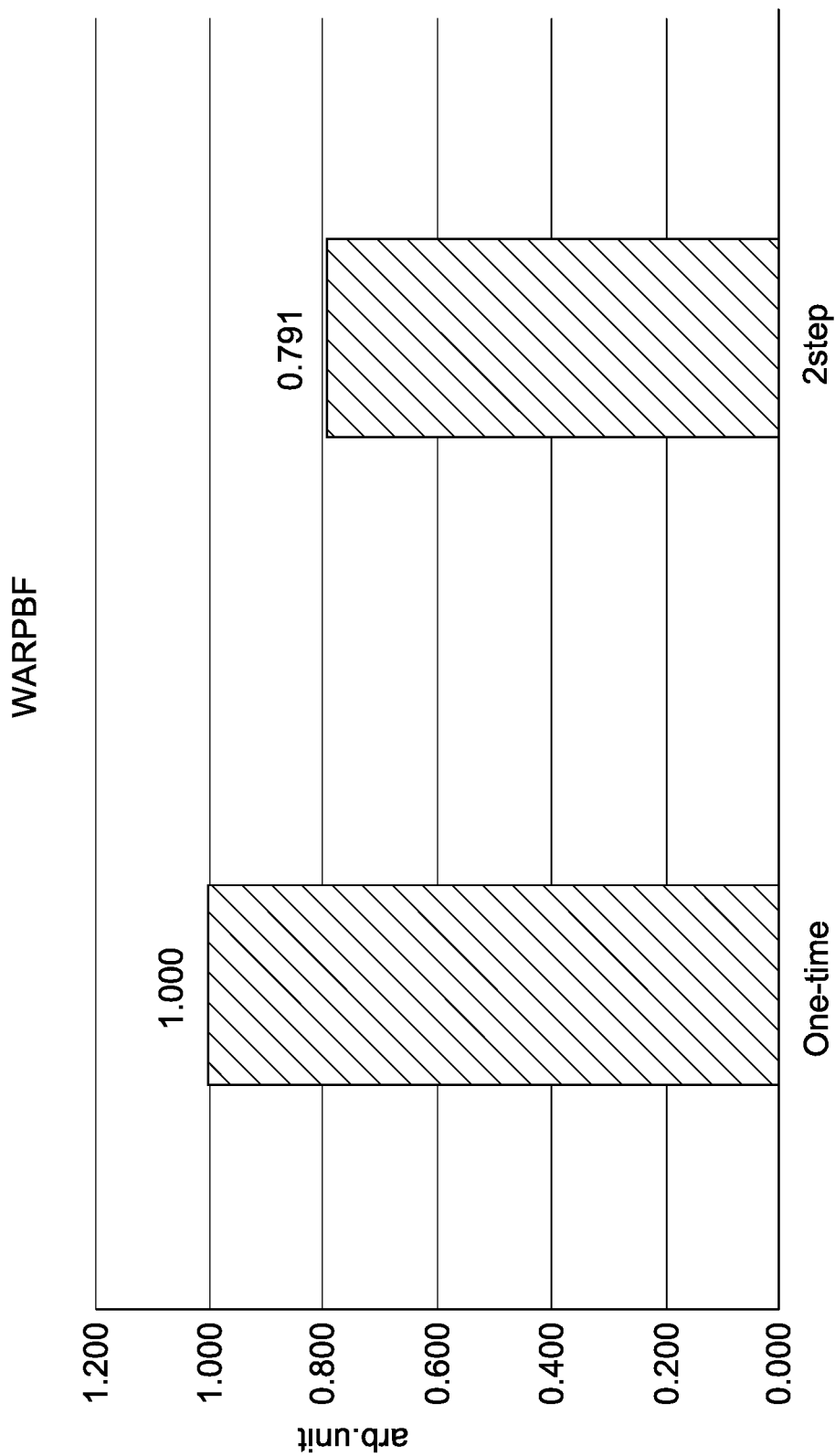
FIG. 6 is a plot comparing wafer warp resulting from a conventional double side grinding operation and from the example process shown in FIGS. 4A and 4B.
Figure 7:
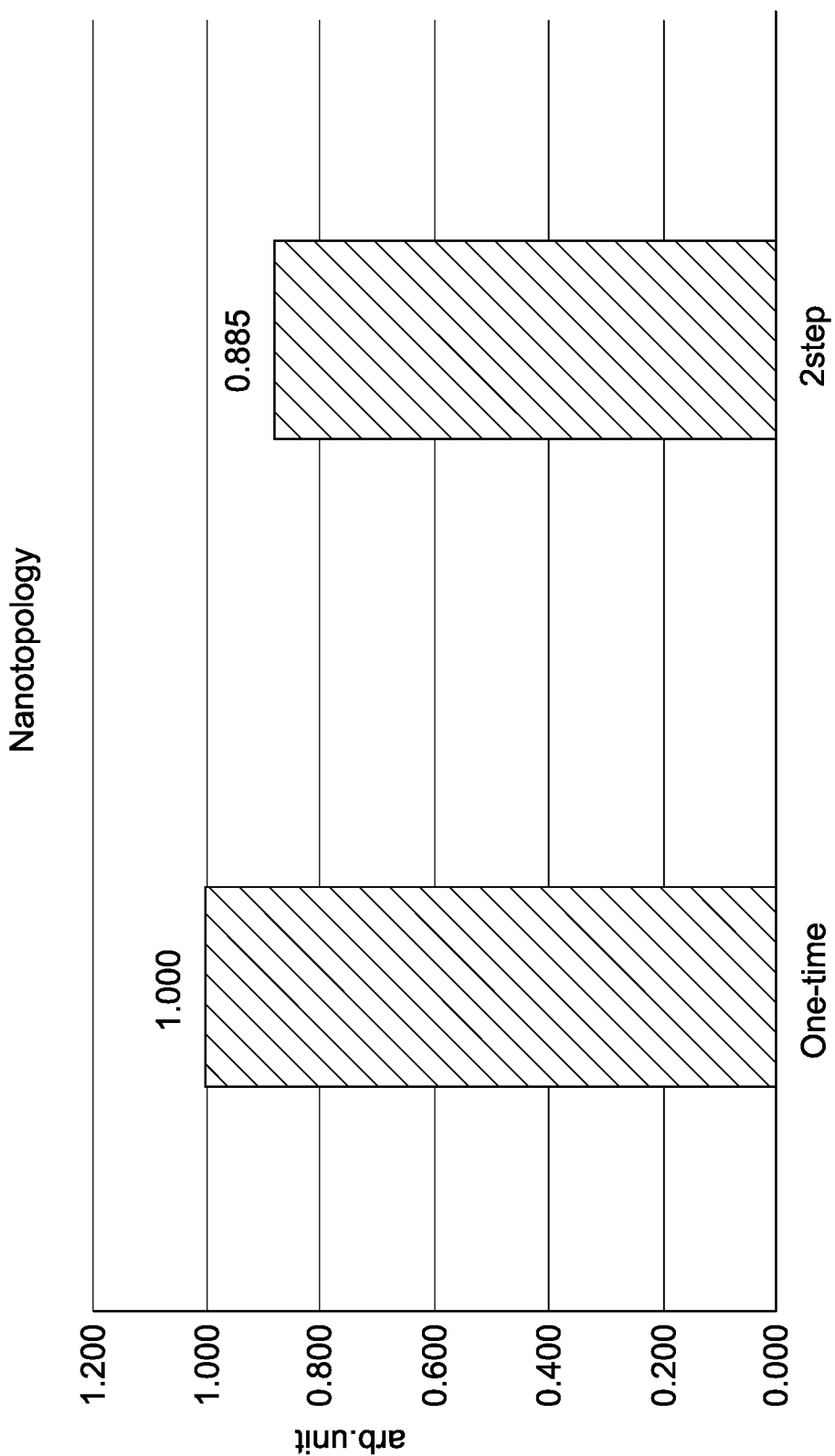
FIG. 7 is a plot comparing wafer surface nanotopology resulting from a conventional double side grinding operation and from the example process shown in FIGS. 4A and 4B.

Referring to FIGS. 5-7, the process flow shown in FIGS. 4A and 4B results in improved wafer flatness characteristics of a double side ground wafer as compared to a double side grinding operation that includes only one grinding operation. In particular, performing the first and second grinding operations shown in FIGS. 4A and 4B enhances the in plane displacement, warp, and nanotopology of the wafer W compared to performing only one grinding operation. The wafer flatness characteristics may be determined, for example, by use of a KLA-Tencor Wafer Inspection System using WaferSight2 or WaferSight2+analysis hardware (Milpitas, California). FIG. 5 shows that in-plane displacement of the wafer reduced when the first and second grinding operations 200*a* and 200*b* are performed. FIG. 6 shows that wafer warp reduced when the first and second grinding operations 200*a* and 200*b* are performed. FIG. 7 shows that nanotopology of the wafer improved when the first and second grinding operations 200*a* and 200*b* are performed.

Figure 8B:
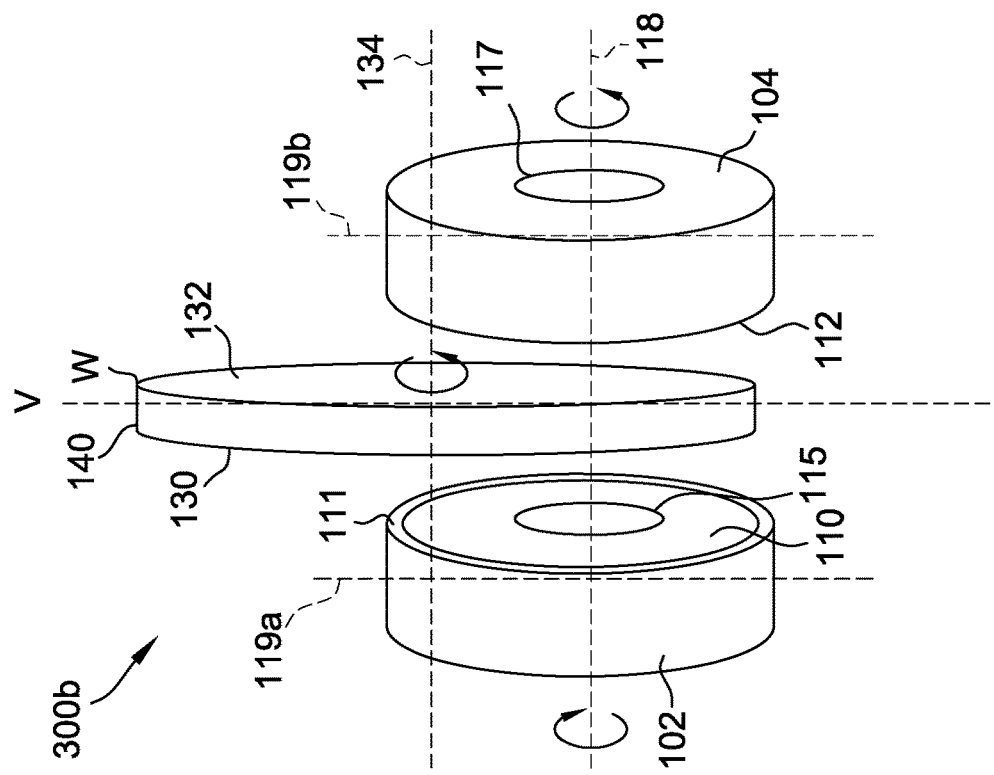
FIGS. 8A-8C are schematics of another example process flow of multiple double side grinding operations performed on a semiconductor wafer.
Figure 8A:
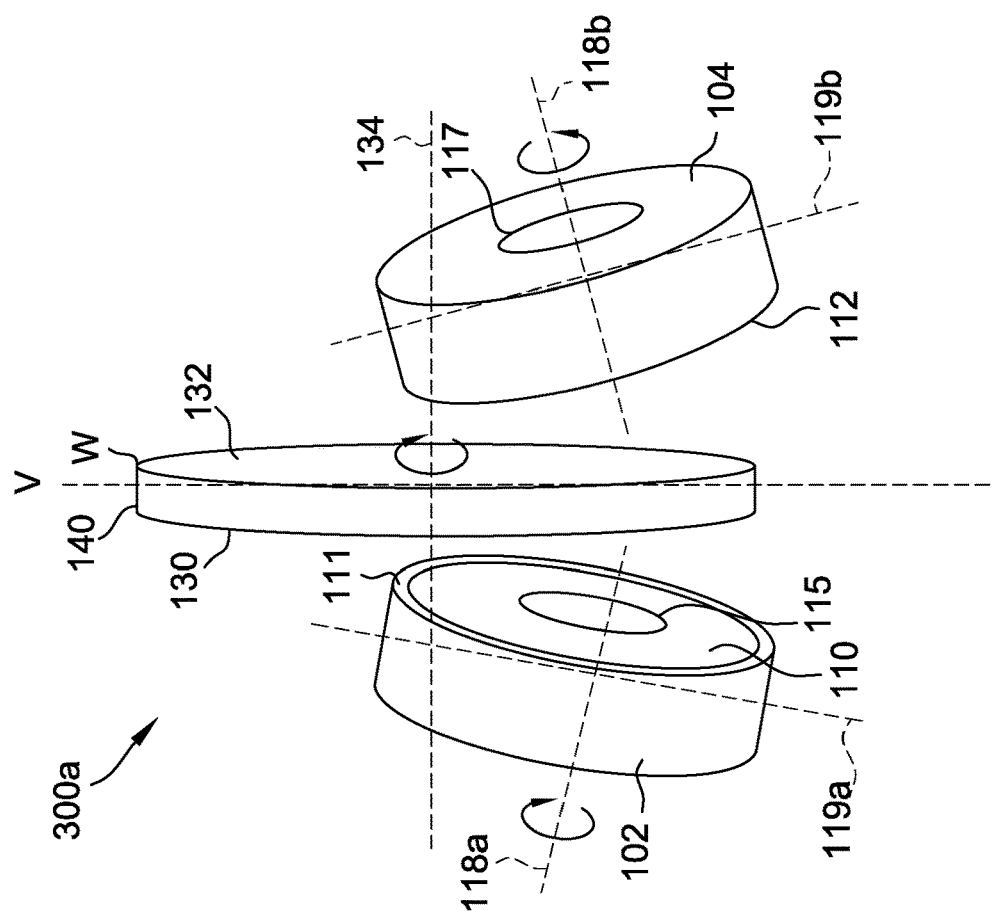
Figure 8C:
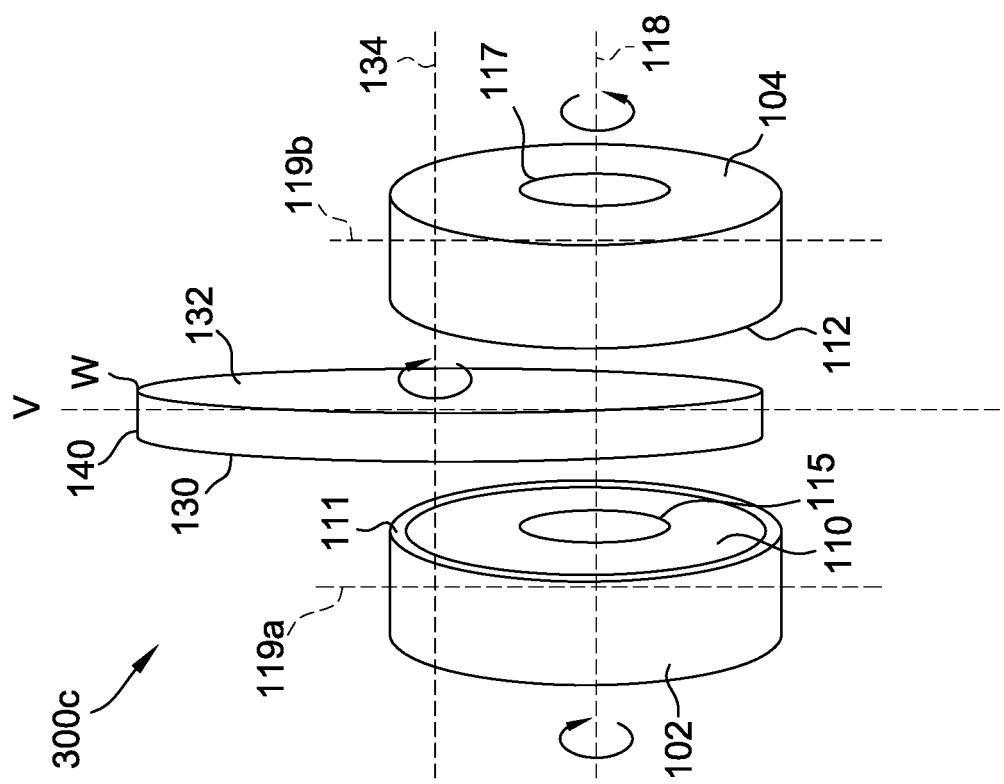

With reference to FIGS. 8A-8C, another example process flow is shown in which a first grinding operation, indicated generally at 300*a* in FIG. 8A, a second grinding operation, indicated generally at 300*b* in FIG. 8B, and a third grinding operation, indicated generally at 300*c* in FIG. 8C, are performed on the wafer W using the grinding apparatus 100. The process flow shown in FIGS. 8A-8C may be performed on multiple wafers W simultaneously or on a single wafer W. As shown in FIG. 8A, in the first grinding operation 300*a*, the wafer W is rotated in a first direction that matches a rotational direction of the grinding wheel 104. In addition, each of the grinding wheels 102 and 104 are oriented such that the diametrical axes 119*a* and 119*b* extend at an oblique angle relative to the front and back surfaces 130 and 132 of the wafer W and the vertical axis V. As such, the grinding wheels 102 and 104 rotate about a rotational axis 118*a* and 118*b*, respectively, that is offset from the central axis 134 of the wafer W. The grinding wheels 102 and 104 may be oriented at the same or a different angle. In some examples, only one of the grinding wheels 102 and 104 is oriented at an angle relative to the surfaces 130 and 132 and the vertical axis V, and the other one of the grinding wheels 102 and 104 is oriented such that the respective diametrical axis 119*a* or 119*b* extends substantially parallel to the surfaces 130 and 132 and the vertical axis V. The tilt angle of the grinding wheels 102 and 104, measured as the angle that the diametrical axis 119*a* and 119*b*, respectively, forms with the vertical axis V, may be from about 0.000001° to about 0.0005°, such as from about 0.00001° to about 0.0001°, or from about 0.00005° to about 0.0001°. The tilt of the grinding wheels 102 and 104 shown in FIG. 8A is exaggerated for ease of illustration and description.

In the second grinding operation 300*b*, shown in FIG. 8B, the wafer is rotated in a second direction that matches a rotational direction of the second grinding wheel 102. Additionally, the grinding wheels 102 and 104 are oriented substantially parallel to the front and back surfaces 130 and 132 of the wafer W and the vertical axis V in the second grinding operation 300*b*. The rotational speed of the wafer W and/or one or both of the grinding wheels 102 and 104 may be adjusted between the first and second grinding operations 300*a* and 300*b*. For example, in the first grinding operation 300*a*, the wafer W may be rotated at a speed between 12 and 24 rpm and, in the second grinding operation, the wafer W may be rotated at a speed between 24 and 36 rpm. Grinding fluid may be supplied to the grinding wheels 102 and/or 104 at a different flow rate between the first and second grinding operations 300*a* and 300*b*. The grinding wheels 102 and 104 may also rotate at different speeds during the second grinding operation 300*b* than the first grinding operation 300*a*. A suitable rotational speed for each of the grinding wheels 102 and 104 for the first and second grinding operations 300*a* and 300*b* may be selected from a speed between 3000 and 5400 rpm.

In the third grinding operation 300*c*, shown in FIG. 8C, the wafer is rotated in the first direction, similar to the first grinding operation 300*a*(FIG. 8A). Additionally, the grinding wheels 102 and 104 are oriented substantially parallel to the front and back surfaces 130 and 132 of the wafer W and the vertical axis V, similar to the second grinding operation 300*b* (FIG. 8B). The rotational speed of the wafer W and/or one or both of the grinding wheels 102 and 104 may be adjusted for the third grinding operation 300*c*. For example, the wafer W may be rotated at a speed between 12 and 24 rpm, similar to that of the first grinding operation 300*a*, or the wafer W may be rotated at a speed between 24 and 36 rpm, similar to that of the second grinding operation 300b. Grinding fluid may be supplied to the grinding wheels 102 and/or 104 at a different flow rate for the third grinding operation 300c than for the first and/or second grinding operations 300a and 300b. The grinding wheels 102 and 104 may also rotate at different speeds during the third grinding operation 300c than the first and/or second grinding operation 300a and 300b. A suitable rotational speed for each of the grinding wheels 102 and 104 for the third grinding operation 300c may be selected from a speed between 3000 and 5400 rpm.

The adjusted parameters shown above for the grinding operations 300a-300c are an example, and grinding process parameters may be adjusted in any alternative manner between the grinding operations 300a-300c to achieve wafer flatness characteristics. The process flow shown in FIGS. 8A-8C is not limited to the specific sequence shown. For example, the third grinding operation 300c may be performed prior to the first grinding operation 300a and/or the second grinding operation 300b. The second grinding operation 300b may be performed prior to the first grinding operation 300a. The first grinding operation 300a may be performed after the second grinding operation 300b and/or the third grinding operation 300c. Additional grinding operations may be performed before, after, or as an intermediate grinding operation to the first grinding operation 300a, the second grinding operation 300b, and the third grinding operation 300c.

Figure 9:
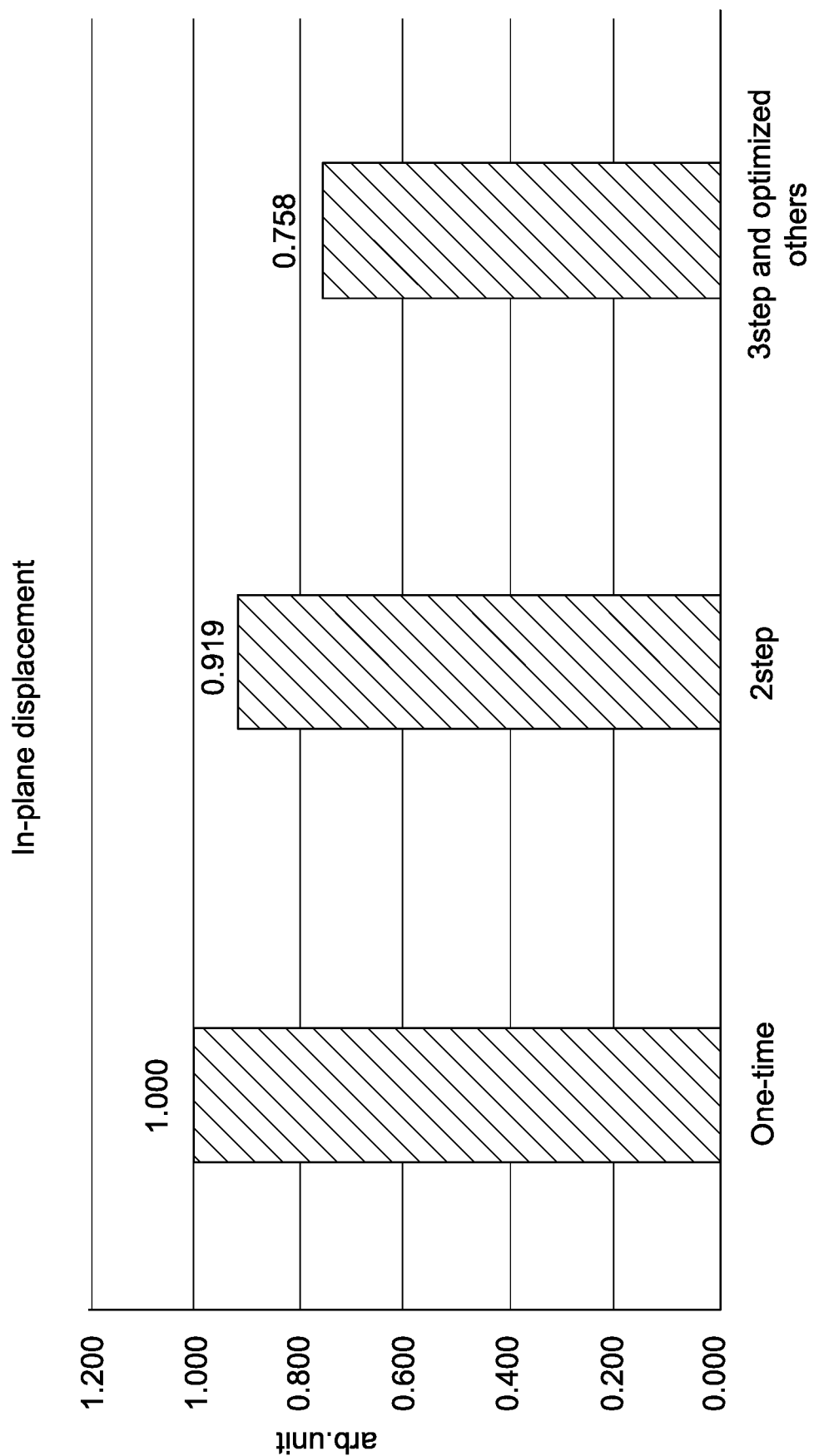
FIG. 9 is a plot comparing wafer in-plane displacement resulting from a conventional double side grinding operation and from the example process shown in FIGS. 8A-8C.
Figure 10:
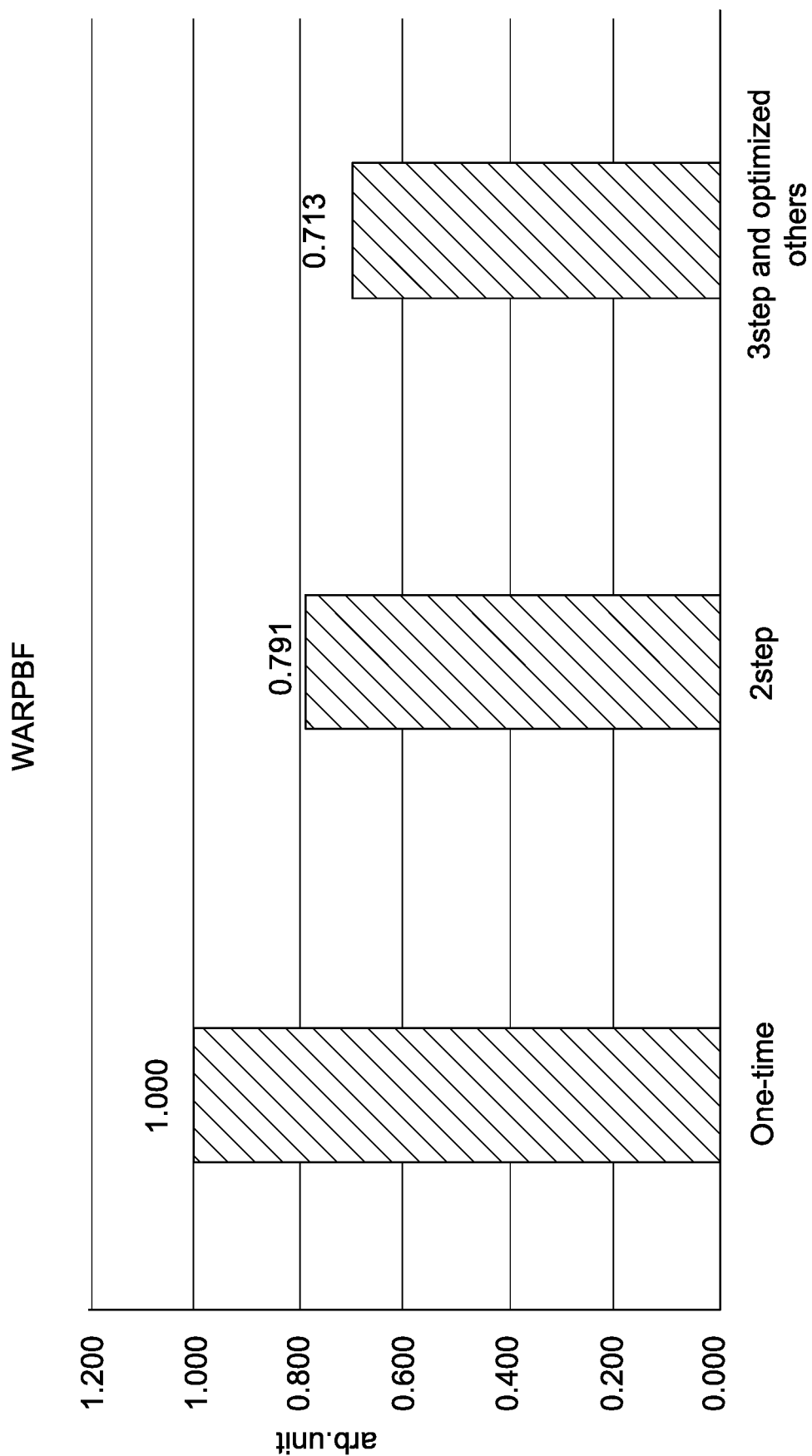
FIG. 10 is a plot comparing wafer warp resulting from a conventional double side grinding operation and from the example process shown in FIGS. 8A-8C.
Figure 11:
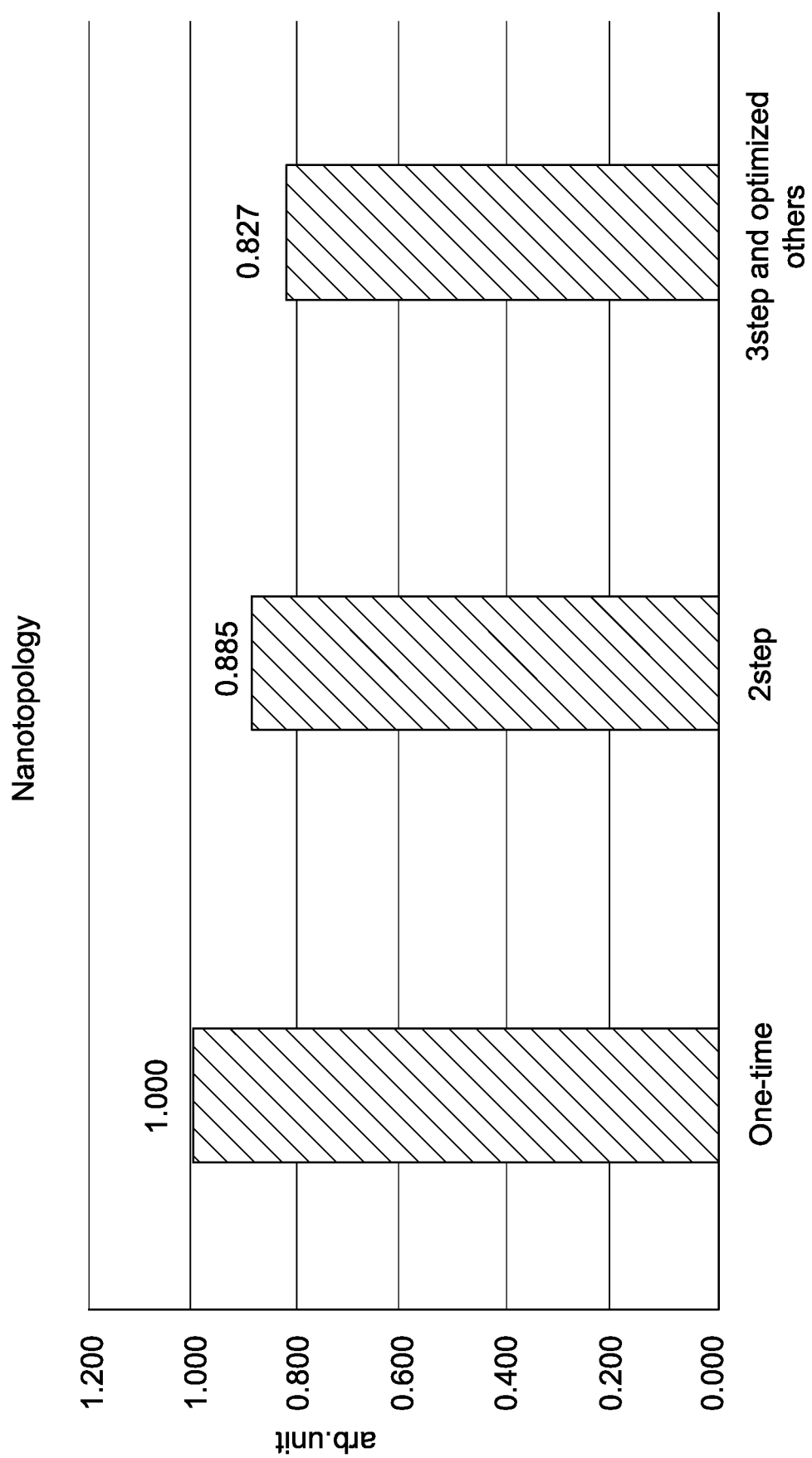
FIG. 11 is a plot comparing wafer surface nanotopology resulting from a conventional double side grinding operation and from the example process shown in FIGS. 8A-8C.

Referring to FIGS. 9-11, the process flow shown in FIGS. 8A-8C results in improved wafer flatness characteristics of a double side ground wafer as compared to a double side grinding operation that includes only one grinding operation. In particular, performing the first, second, and third grinding operations shown in FIGS. 8A-8C enhances the in plane displacement, warp, and nanotopology of the wafer W compared to performing only one grinding operation. The wafer flatness characteristics may be determined, for example, by use of a KLA-Tencor Wafer Inspection System using WaferSight2 or WaferSight2+analysis hardware (Milpitas, California). FIG. 9 shows that in-plane displacement of the wafer reduced when the grinding operations 300a-300c are performed. FIG. 10 shows that wafer warp reduced when the grinding operations 300a-300c are performed. FIG. 11 shows that nanotopology of the wafer improved when the grinding operations 300a-300c are performed. Additionally, FIGS. 9-11 further demonstrate that wafer flatness characteristics may be improved between the second and third grinding operations 300b and 300c. Thus, providing further grinding operations facilitates optimizing wafer flatness characteristics resulting from the double side grinding process.

As compared to conventional methods for processing semiconductor wafers using double side grinding, methods of the present disclosure have several advantages. By performing multiple (i.e., two or more) grinding operations on the semiconductor wafer, the wafer flatness characteristics can be significantly improved. In particular, grinding process parameters are adjusted and optimized between the multiple grinding operations to achieve the desired wafer flatness characteristics. This produces semiconductor wafers that are capable of meeting strict flatness requirements required for device fabrication (e.g., in the production of integrated circuit chips). As a result, manufacturing costs and yield loss associated with low quality semiconductor wafers can be substantially reduced. The grinding process parameters may also be adjusted to consistently produce semiconductor wafers that have the desired wafer flatness characteristics, further increasing yield and reducing manufacturing costs associated with low quality wafers.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment (s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", "down", "up", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of processing a semiconductor wafer using a double side grinding apparatus that includes a first grinding wheel, a second grinding wheel, and a carrier for supporting the wafer between the first and second grinding wheels, the wafer having a front surface and a back surface, the method comprising:

placing the wafer in the carrier such that the first grinding wheel engages the front surface of the wafer and the second grinding wheel engages the back surface of the wafer;

performing a first grinding operation of the double side grinding apparatus on the wafer in which the first and second grinding wheels rotate in counter-rotation manner relative to each other and the wafer is rotated in a first direction that matches a rotational direction of the first grinding wheel, whereby a first portion of at least one of the front and back surfaces of the wafer is removed;

performing a second grinding operation of the double side grinding apparatus on the wafer in which the first and second grinding wheels rotate in counter-rotation manner relative to each other and the wafer is rotated in a second direction that matches a rotational direction of the second grinding wheel, whereby a second portion of at least one of the front and back surfaces of the wafer is removed; and performing a third grinding operation of the double side grinding apparatus on the wafer in which the first and second grinding wheels rotate in counter-rotation manner relative to each other and the wafer is rotated in the first direction or the second direction, whereby a third portion of at least one of the front and back surfaces of the wafer is removed.

2. The method of claim 1, wherein performing the second grinding operation comprises rotating at least one of the first grinding wheel, the second grinding wheel, and the wafer at a second rotational speed that is different than a first rotational speed of the at least one of the first grinding wheel, the second grinding wheel, and the wafer during the first grinding operation.

3. The method of claim 2, wherein performing the second grinding operating comprises rotating the wafer at a second rotational speed that is different than a first rotational speed of the wafer during the first grinding operation.

4. The method of claim 3, wherein the second rotational speed of the wafer is greater than the first rotational speed of the wafer.

5. The method of claim 1, wherein performing the second grinding operation comprises positioning at least one of the first grinding wheel and the second grinding wheel at a second orientation relative the wafer that is different than a first orientation of the at least one of the first grinding wheel and the second grinding wheel during the first grinding operation.

6. The method of claim 5, wherein, in one of the first orientation and the second orientation, the at least one of the first grinding wheel and the second grinding wheel is oriented at an oblique angle relative to the wafer and, in the other one of the first orientation and the second orientation, the at least one of the first grinding wheel and the second grinding wheel is oriented substantially parallel to the wafer.

7. The method of claim 1, wherein performing the second grinding operation comprises supplying grinding fluid to the double side grinding apparatus at a second flow rate that is different than a first flow rate of the grinding fluid supplied during the first grinding operation.

8. The method of claim 1, wherein performing the second grinding operation further comprises adjusting, relative to the first grinding operation, at least one process parameter selected from the group consisting of a rotational speed of the wafer, a rotational speed of the first grinding wheel, a rotational speed of the second grinding wheel, an orientation of the first grinding wheel relative to the wafer, an orientation of the second grinding wheel relative to the wafer, and a flow rate of grinding fluid supplied to the double side grinding apparatus.

9. The method of claim 1, wherein performing the second grinding operation whereby the second portion of at least one of the front and back surfaces of the wafer is removed enhances at least one of in plane displacement, warp, and nanotopology of the wafer.

10. A method of processing a semiconductor wafer using a double side grinding apparatus that includes a first grinding wheel, a second grinding wheel, and a carrier for supporting the wafer between the first and second grinding wheels, the wafer having a front surface and a back surface, the method comprising:
placing the wafer in the carrier such that the first grinding wheel engages the front surface of the wafer and the second grinding wheel engages the back surface of the wafer;
performing a first grinding operation of the double side grinding apparatus on the wafer in which the first and second grinding wheels rotate in counter-rotation manner relative to each other and the wafer is rotated in a wafer rotation direction that matches a rotational direction of one of the first grinding wheel and the second grinding wheel, whereby a first portion of at least one of the front and back surfaces of the wafer is removed;
performing a second grinding operation of the double side grinding apparatus on the wafer in which at least one process parameter is adjusted relative to the first grinding operation, whereby a second portion of at least one of the front and back surfaces of the wafer is removed to enhance at least one of in plane displacement, warp, and nanotopology of the wafer; and
performing a third grinding operation of the double side grinding apparatus on the wafer, whereby a third portion of at least one of the front and back surfaces of the wafer is removed.

11. The method of claim 10, wherein the at least one process parameter is selected from the group consisting of the wafer rotation direction, a rotational speed of the wafer, a rotational speed of the first grinding wheel, a rotational speed of the second grinding wheel, an orientation of the first grinding wheel relative to the wafer, an orientation of the second grinding wheel relative to the wafer, and a flow rate of grinding fluid supplied to the double side grinding apparatus.

12. The method of claim 10, wherein performing the third grinding operation of the double side grinding apparatus comprises adjusting at least one process parameter relative to the first grinding operation or the second grinding operation, whereby the third portion of at least one of the front and back surfaces of the wafer is removed to enhance at least one of in plane displacement, warp, and nanotopology of the wafer.

13. The method of claim 10, wherein performing the second grinding operation comprises rotating the wafer in an opposite wafer direction that matches a rotational direction of the other one of the first grinding wheel and the second grinding wheel.

14. The method of claim 10, wherein the at least one process parameter is a rotational speed of the wafer, wherein performing the second grinding operating comprises rotating the wafer at a second rotational speed that is greater than a first rotational speed of the wafer during the first grinding operation.

15. The method of claim 10, wherein the at least one process parameter comprises at least one of an orientation of the first grinding wheel relative to the wafer and an orientation of the second grinding wheel relative to the wafer, wherein performing the second grinding operation comprises positioning at least one of the first grinding wheel and the second grinding wheel at a second orientation relative the wafer that is different than a first orientation of the at least one of the first grinding wheel and the second grinding wheel during the first grinding operation.

16. The method of claim 10, wherein the at least one process parameter comprises a flow rate of grinding fluid supplied to the double side grinding apparatus, wherein performing the second grinding operation comprises supplying grinding fluid to the double side grinding apparatus at a second flow rate that is different than a first flow rate of the grinding fluid supplied during the first grinding operation.

17. A method of processing semiconductor wafers using a double side grinding apparatus that includes first grinding wheels, second grinding wheels each corresponding to one of the first grinding wheels, and carriers for respectively supporting each of the wafers between one of the first grinding wheels and the corresponding second grinding wheel during a grinding operation, each wafer having a front surface and a back surface, the method comprising, for each wafer:

placing the wafer in the respective carrier such that the first grinding wheel engages the front surface of the respective wafer and the corresponding second grinding wheel engages the back surface of the respective wafer;

performing a first grinding operation of the double side grinding apparatus on the wafer in which the first and corresponding second grinding wheels rotate in counter-rotation manner relative to each other and the respective wafer is rotated in a wafer rotation direction that matches a rotational direction of the first grinding wheel, whereby a first portion of at least one of the front and back surfaces of the respective wafer is removed;

performing a second grinding operation of the double side grinding apparatus on the wafer in which the first and corresponding second grinding wheels rotate in counter-rotation manner relative to each other and the respective wafer is rotated in a second direction that matches a rotational direction of the second grinding wheel, whereby a second portion of at least one of the front and back surfaces of the respective wafer is removed; and performing a third grinding operation of the double side grinding apparatus on the wafer, whereby a third portion of at least one of the front and back surfaces of the respective wafer is removed.

18. The method of claim 17, further comprising, for each wafer, performing the third grinding operation in which at least one process parameter selected from the group consisting of a rotational speed of the respective wafer, a rotational speed of the first grinding wheel, a rotational speed of the second grinding wheel, an orientation of the first grinding wheel relative to the respective wafer, an orientation of the second grinding wheel relative to the respective wafer, and a flow rate of grinding fluid supplied to the double side grinding apparatus is adjusted relative to at least one of the first grinding operation and the second grinding operation.

19. The method of claim 17, wherein performing the second grinding operation whereby the second portion of at least one of the front and back surfaces of the respective wafer is removed enhances at least one of in plane displacement, warp, and nanotopology of the respective wafer.

* * * * *